(12) United States Patent
Hamman

(10) Patent No.: US 7,466,553 B2
(45) Date of Patent: Dec. 16, 2008

(54) COOLING SYSTEM

(75) Inventor: Brian A. Hamman, Krugerville, TX (US)

(73) Assignee: QNX Cooling Systems, Inc., Krugerville, TX (US)

(*) Notice: Subject to any disclaimer, the term of this patent is extended or adjusted under 35 U.S.C. 154(b) by 108 days.

(21) Appl. No.: 11/585,027

(22) Filed: Oct. 24, 2006

(65) Prior Publication Data

US 2007/0035928 A1 Feb. 15, 2007

Related U.S. Application Data

(63) Continuation of application No. 10/715,322, filed on Nov. 14, 2003, now Pat. No. 7,218,523, and a continuation-in-part of application No. 10/666,189, filed on Sep. 10, 2003, now Pat. No. 6,999,316.

(51) Int. Cl.
  *H05K 7/20* (2006.01)
  *H01L 23/38* (2006.01)
  *F25B 21/02* (2006.01)

(52) U.S. Cl. .................. 361/718; 361/701; 361/712; 257/E23.082; 257/930; 62/3.2

(58) Field of Classification Search .............. 361/701, 361/712, 717–719; 257/713, 714, E23.082, 257/930; 165/272
See application file for complete search history.

(56) References Cited

U.S. PATENT DOCUMENTS

| | | | | |
|---|---|---|---|---|
| 5,456,081 A | * | 10/1995 | Chrysler et al. | 62/3.7 |
| 5,731,954 A | * | 3/1998 | Cheon | 361/699 |
| 5,934,079 A | * | 8/1999 | Han et al. | 62/3.2 |
| 5,987,893 A | * | 11/1999 | Schulz-Harder et al. | 62/3.7 |
| 6,164,076 A | * | 12/2000 | Chu et al. | 62/3.7 |
| 6,196,003 B1 | * | 3/2001 | Macias et al. | 62/3.7 |
| 6,234,240 B1 | * | 5/2001 | Cheon | 165/80.3 |
| 6,586,835 B1 | * | 7/2003 | Ahn et al. | 257/717 |
| 6,658,861 B1 | * | 12/2003 | Ghoshal et al. | 62/3.7 |
| 6,705,089 B2 | * | 3/2004 | Chu et al. | 62/3.2 |
| 6,711,904 B1 | * | 3/2004 | Law et al. | 62/3.2 |
| 2004/0084781 A1 | * | 5/2004 | Ahn et al. | 257/777 |

FOREIGN PATENT DOCUMENTS

JP 62176152 A * 8/1987

* cited by examiner

*Primary Examiner*—Anatoly Vortman
(74) *Attorney, Agent, or Firm*—Patent Dominion LP

(57) ABSTRACT

Liquid cooling systems and apparatus are presented. A number of embodiments are presented. In each embodiment, a heat transfer system capable of thermally coupling to heat generating components and adapted to transfer heat from the heat generating components is implemented. A variety of embodiments of the heat transfer system are presented. For example, several embodiments of a heat transfer system including electron-conducting material is presented. In one embodiment of the present invention, the electron conducting material operates under the peltier principal.

20 Claims, 10 Drawing Sheets

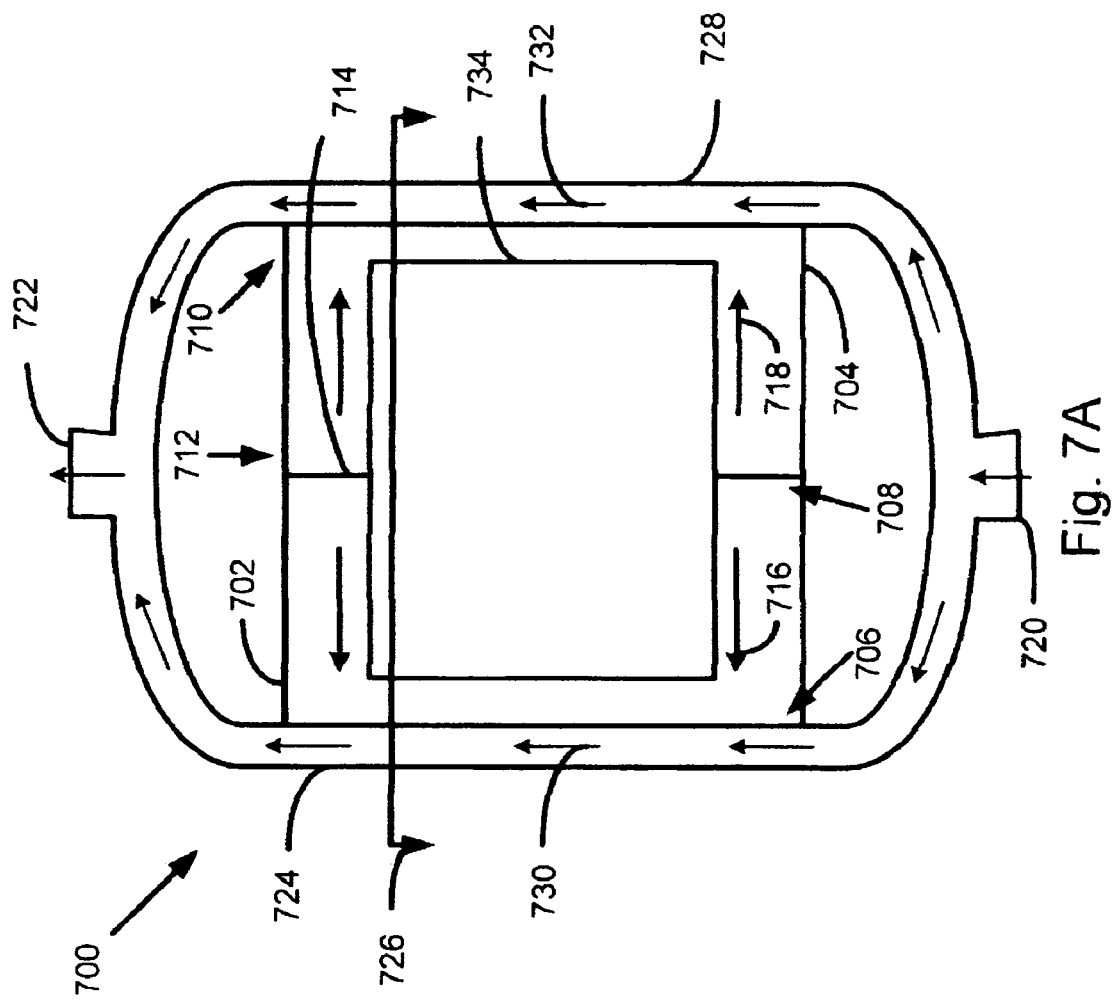

COOLING SYSTEM

CROSS REFERENCE TO RELATED APPLICATIONS

The present application is a continuation application of application Ser. No. 10/715,322 filed on Nov. 14, 2003 now U.S. Pat. No. 7,218,523, entitled "Liquid Cooling System". The priority date of such application is claimed for the present application. The present application is also a continuation-in-part of application Ser. No. 10/666,189, filed Sep. 10, 2003, now U.S. Pat. No. 6,999,316, entitled "Liquid Cooling System," and which is herein incorporated by reference and application Ser. No. 10/688,587, filed Oct. 18, 2003, entitled "Liquid Cooling System," and which is herein incorporated by reference.

BACKGROUND OF THE INVENTION

Processors are at the heart of most computing systems. Whether a computing system is a desktop computer, a laptop computer, a communication system, a television, etc., processors are often the fundamental building block of the system. These processors may be deployed as central processing units, as memories, controllers, etc.

As computing systems advance, the power of the processors driving these computing systems increases. The speed and power of the processors are achieved by using new combinations of materials, such as silicon, germanium, etc., and by populating the processor with a larger number of circuits. The increased circuitry per area of processor as well as the conductive properties of the materials used to build the processors result in the generation of heat. Further, as these computing systems become more sophisticated, several processors are implemented within the computing system and generate heat. In addition to the processors, other systems operating within the computing system may also generate heat and add to the heat experienced by the processors.

A range of adverse effects result from the increased heat. At one end of the spectrum, the processor begins to malfunction from the heat and incorrectly processes information. This may be referred to as computing breakdown. For example, when the circuits on a processor are implemented with digital logic devices, the digital logic devices may incorrectly register a logical zero or a logical one. For example, logical zeros may be mistaken as logical ones or vice versa. On the other hand, when the processors become too heated, the processors may experience a physical breakdown in their structure. For example, the metallic leads or wires connected to the core of a processor may begin to melt and/or the structure of the semiconductor material (i.e., silicon, germanium, etc.) itself may breakdown once certain heat thresholds are met. These types of physical breakdowns may be irreversible and render the processor and computer system inoperable and unrepairable.

A number of approaches have been implemented to address processor heating. Initial approaches focused on air-cooling. These techniques may be separated into 3 categories: 1) cooling techniques which focused on cooling the air outside of the computing system; 2) cooling techniques that focused on cooling the air inside the computing system; and 3) a combination of the cooling techniques (i.e., 1 and 2).

Many of these conventional approaches are elaborate and costly. For example, one approach for cooling air outside of the computing system involves the use of a cold room. A cold room is typically implemented in a specially constructed data center, which includes air conditioning units, specialized flooring, walls, etc., to generate and retain as much cooled air within the cold room as possible.

Cold rooms are very costly to build and operate. The specialized buildings, walls, flooring, air conditioning systems, and the power to run the air conditioning systems all add to the cost of building and operating the cold room. In addition, an elaborate ventilation system is typically also implemented and in some cases additional cooling systems may be installed in floors and ceilings to circulate a high volume of air through the cold room. Further, in these cold rooms, computing equipment is typically installed in specialized racks to facilitate the flow of cooled air around and through the computing system. However, with decreasing profit margins in many industries, operators are not willing to incur the expenses associated with operating a cold room. In addition, as computing systems are implemented in small companies and in homes, end users are unable and unwilling to incur the cost associated with the cold room, which makes the cold room impractical for this type of user.

The second type of conventional cooling technique focused on cooling the air surrounding the processor. This approach focused on cooling the air within the computing system. Examples of this approach include implementing simple ventilation holes or slots in the chassis of a computing system, deploying a fan within the chassis of the computing system, etc. However, as processors become more densely populated with circuitry and as the number of processors implemented in a computing system increases, cooling the air within the computing system can no longer dissipate the necessary amount of heat from the processor or the chassis of a computing system.

Conventional techniques also involve a combination of cooling the air outside of the computing system and cooling the air inside the computing system. However, as with the previous techniques, this approach is also limited. The heat produced by processors has quickly exceeded beyond the levels that can be cooled using a combination of the air-cooling techniques mentioned above.

Other conventional methods of cooling computing systems include the addition of heat sinks. Very sophisticated heat sink designs have been implemented to create heat sinks that can remove the heat from a processor. Further, advanced manufacturing techniques have been developed to produce heat sinks that are capable of removing the vast amount of heat that can be generated by a processor. However, in most heat sinks, the size of the heat sink is directly proportional to the amount of heat that can be dissipated by the heat sink. Therefore, the more heat to be dissipated by the heat sink, the larger the heat sink. Certainly, larger heat sinks can always be manufactured; however, the size of the heat sink can become so large that heat sinks become infeasible.

Refrigeration techniques and heat pipes have also been used to dissipate heat from a processor. However, each of these techniques has limitations. Refrigeration techniques require substantial additional power, which drains the battery in a computing system. In addition, condensation and moisture, which is damaging to the electronics in computing systems, typically develops when using the refrigeration techniques. Heat pipes provide yet another alternative; however, conventional heat pipes have proven to be ineffective in dissipating the large amount of heat generated by a processor.

In yet another approach for managing the heat issues associated with a processor, designers have developed methods for controlling the operating speed of a processor to manage the heat generated by the processor. In this approach, the processing speed is throttled based on the heat produced by the processor. For example, as the processor heats to dangerous limits (i.e., computing breakdown or structural breakdown), the processing speed is stepped down to a lower speed.

At the lower speed, the processor is able to operate without experiencing computing breakdown or structural breakdown. However, this often results in a processor operating at a level below the level that the processor was marketed to the public or rated. This also results in slower overall performance of the computing system. For example, many conventional chips incorporate a speed step methodology. Using the speed step method, a processor reduces its speed by a percentage once the processor reaches a specific thermal threshold. If the processor continues to heat up to the second thermal threshold, the processor will reduce its speed by an additional 25 percent of its rated speed. If the heat continues to rise, the speed step methodology will continue to reduce the speed to a point where the processor will stop processing data and the computer will cease to function.

As a result of implementing the speed step technology, a processor marketed as a one-gigahertz processor may operate at 250 megahertz or less. Therefore, although this may protect a processor from structural breakdown or computing breakdown, it reduces the operating performance of the processor and the ultimate performance of the computing system. While this may be a feasible solution, it is certainly not an optimal solution because processor performance is reduced using this technique. Therefore, thermal (i.e., heat) issues negate the tremendous amount of research and development expended to advance processor performance.

In addition to the thermal issues, a heat dissipation method and/or apparatus must be deployed in the chassis of a computing system, which has limited space. Further, as a result of the competitive nature of the electronics industry, the additional cost for any heat dissipation method or apparatus must be very low or incremental.

Thus, there is a need in the art for a method and apparatus for cooling computing systems. There is a need in the art for a method and apparatus for cooling processors deployed within a computing system. There is a need in the art for an optimal, cost-effective method and apparatus for cooling processors, which also allows the processor to operate at the marketed operating capacity. There is a need for a method or apparatus used to dissipate processor heat which can be deployed within the small footprint available in the case or housing of a computing system, such as a laptop computer, standalone computer, cellular telephone, etc.

SUMMARY OF THE INVENTION

A method and apparatus for dissipating heat from processors are presented. A variety of heat transfer systems are implemented. Liquid is used in combination with the heat transfer system to dissipate heat from a processor. Each heat transfer system is combined with a heat exchange system. Each heat exchange system receives heated liquid and produces cooled liquid.

During operation, each heat transfer system may be mated with a processor, which produces heat. Liquid is processed through the heat transfer system to dissipate the heat. As the liquid is processed through the heat transfer system the liquid becomes heated liquid. The heated liquid is transported to the heat exchange system. The heat exchange system receives the heated liquid and produces cooled liquid. The cooled liquid is then transported back to the heat transfer system to dissipate the heat produced by the processor.

A liquid cooling system comprising a first electron conducting material including a first hot region and a first cold region capable of mating with a processor generating heat; a second electron conducting material including a second hot region and a second cold region coupled to the first cold region, the second cold region capable of mating with the processor generating heat; an inlet receiving cooled liquid; a first conduit coupled to the inlet and coupled to the first hot region, the first conduit conveying the cooled liquid and dissipating heat from the first hot region in response to the cooled liquid; a second conduit coupled to the inlet and coupled to the second hot region, the second conduit conveying the cooled liquid and dissipating heat from the second hot region in response to the cooled liquid; and an outlet coupled to the first conduit and coupled to the second conduit, the outlet outputting heated liquid in response to the cooled liquid conveyed on the first conduit and in response to the cooled liquid conveyed on the second conduit liquid.

A liquid cooling system comprising a heat transfer unit operating under the peltier effect, the heat transfer unit including a cold region and a hot region generating heat, wherein the cold regions is capable of mating with a processor; a conduit coupled to the hot region and dissipating heat by transporting cooled liquid, the cooled liquid transforming into heated liquid in response to the heat from the hot region; and a heat exchange unit coupled to the conduit and receiving the heated liquid, the heat exchange unit generating the cooled liquid in response to receiving the heated liquid.

A liquid cooling system comprising a first heat transfer unit operating under the peltier effect, the heat transfer unit including a first cold region and a first hot region generating heat, wherein the cold region is capable of mating with a processor on a first interface and dissipating heat from the first side; and a second heat transfer unit operating under the peltier effect, the second heat transfer unit including a second cold region and a second hot region generating heat, wherein the second cold region is capable of mating with a processor on a second side and dissipating heat from the second side.

BRIEF DESCRIPTION OF THE DRAWINGS

FIG. 7A displays a bottom view of an embodiment of a heat transfer system, such as a solid-state system implemented in accordance with the teachings of the present invention.

DETAILED DESCRIPTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

A variety of liquid cooling systems are presented. In each embodiment of the present invention, a heat transfer system in combination with a heat exchange system is used to dissipate heat from a processor. The various heat transfer systems may be intermixed with the heat exchange systems to create a variety of liquid cooling systems.

Several heat transfer systems are presented. Each heat transfer system may be used with a variety of heat exchange systems. For example, a heat transfer system is presented; a direct-exposure heat transfer system is presented; a dual-surface heat transfer system is presented; a dual-surface, direct-exposure heat transfer system is presented; a multi-processor, heat transfer system is presented; a multi-processor, dual-surface direct exposure heat transfer system is presented; a multi-surface heat transfer system is presented; a multi-surface, direct-emersion heat transfer system is presented; a circuit-board heat transfer system is presented. In addition, it should be appreciated that combinations and variations of the foregoing heat transfer systems may be implemented and are within the scope of the present invention.

Figure 1:
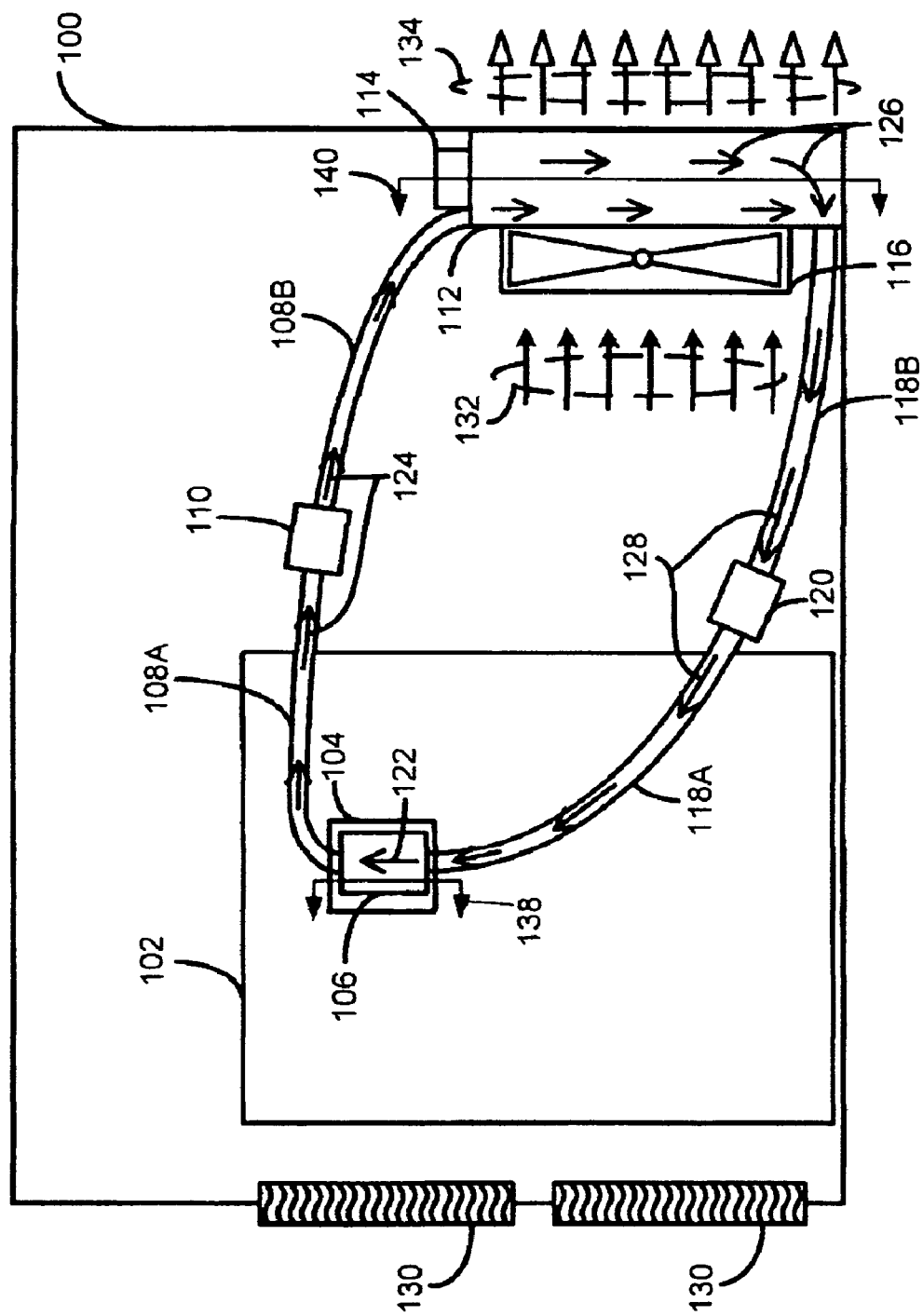
FIG. 1 displays a system view of a liquid cooling system disposed in a housing and implemented in accordance with the teachings of the present invention.
Figure 2:
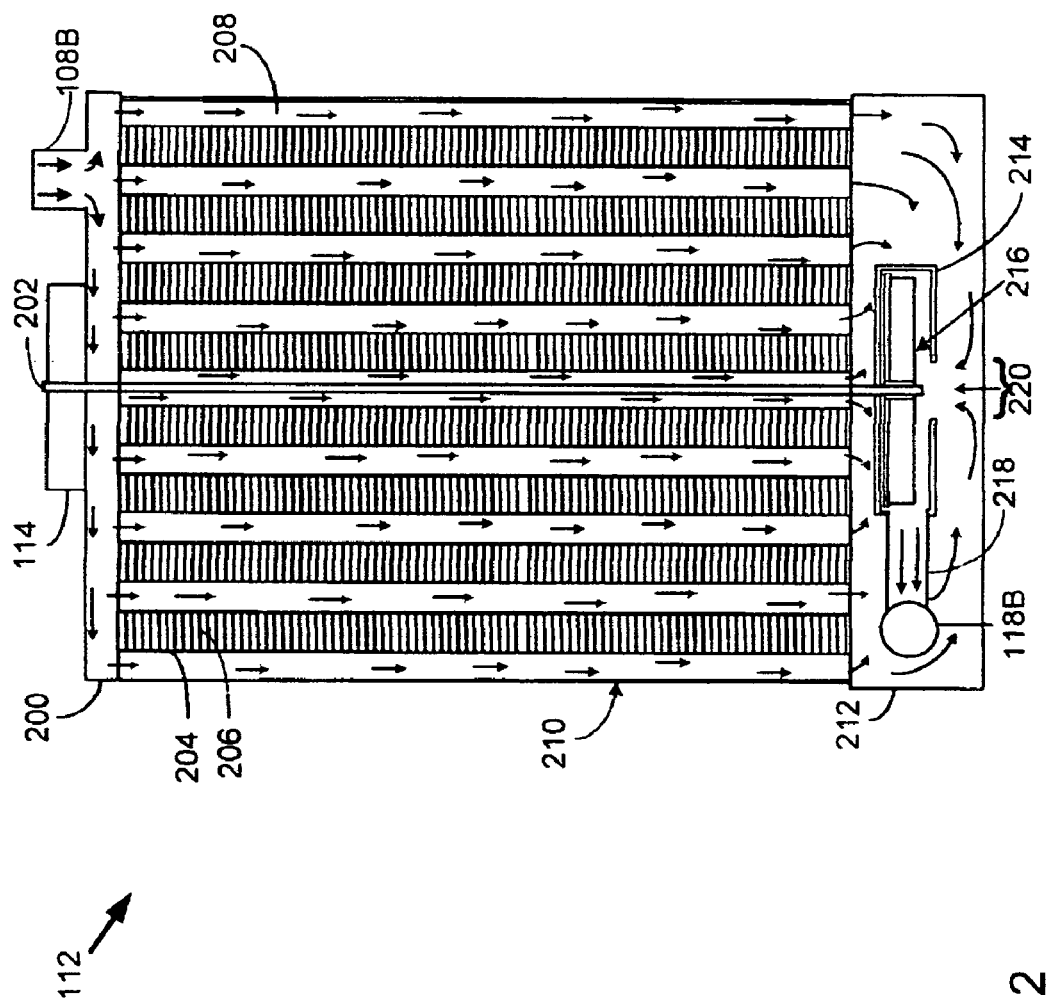
FIG. 2 displays a sectional view of a heat exchange system implemented in accordance with the teachings of the present invention.
Figure 3:
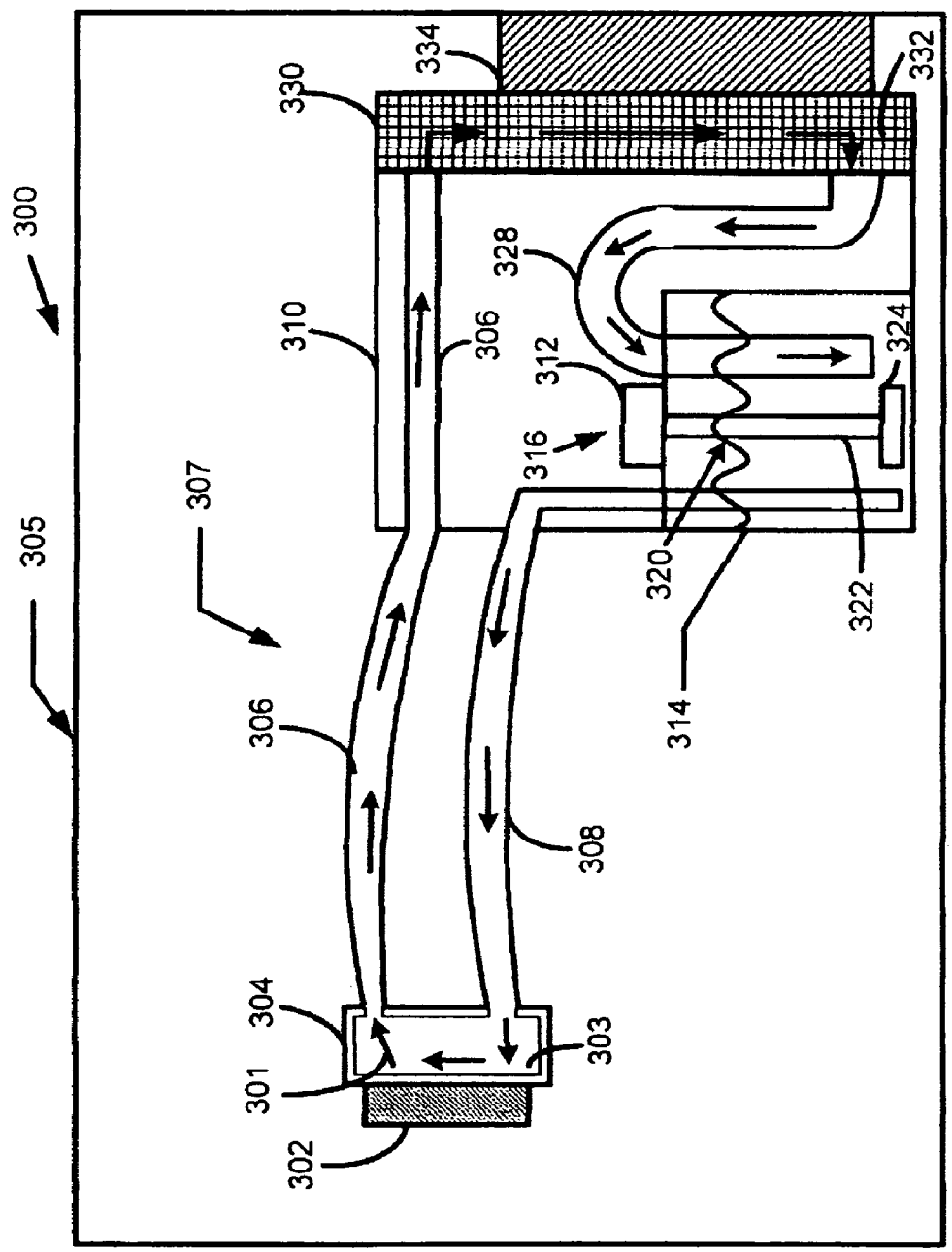
FIG. 3 displays a system view of a liquid cooling system disposed in a housing and implemented in accordance with the teachings of the present invention.
Figure 4:
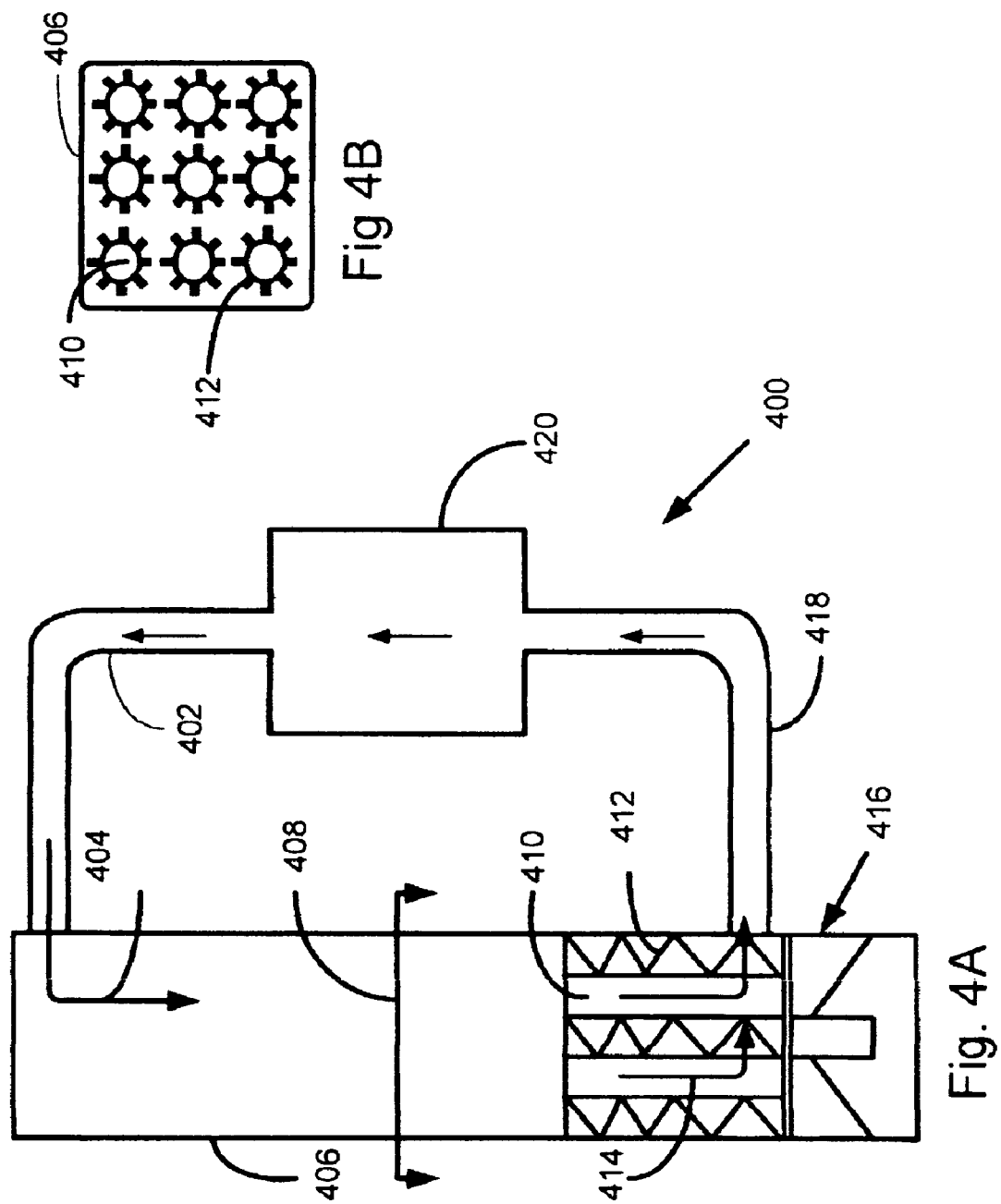
FIG. 4A displays a system view of a liquid cooling system suitable for use in a mobile computing environment, such as a laptop, and implemented in accordance with the teachings of the present invention.
FIG. 4B displays a cross-sectional view of the heat exchange system depicted in FIG. 4A.
Figure 5:
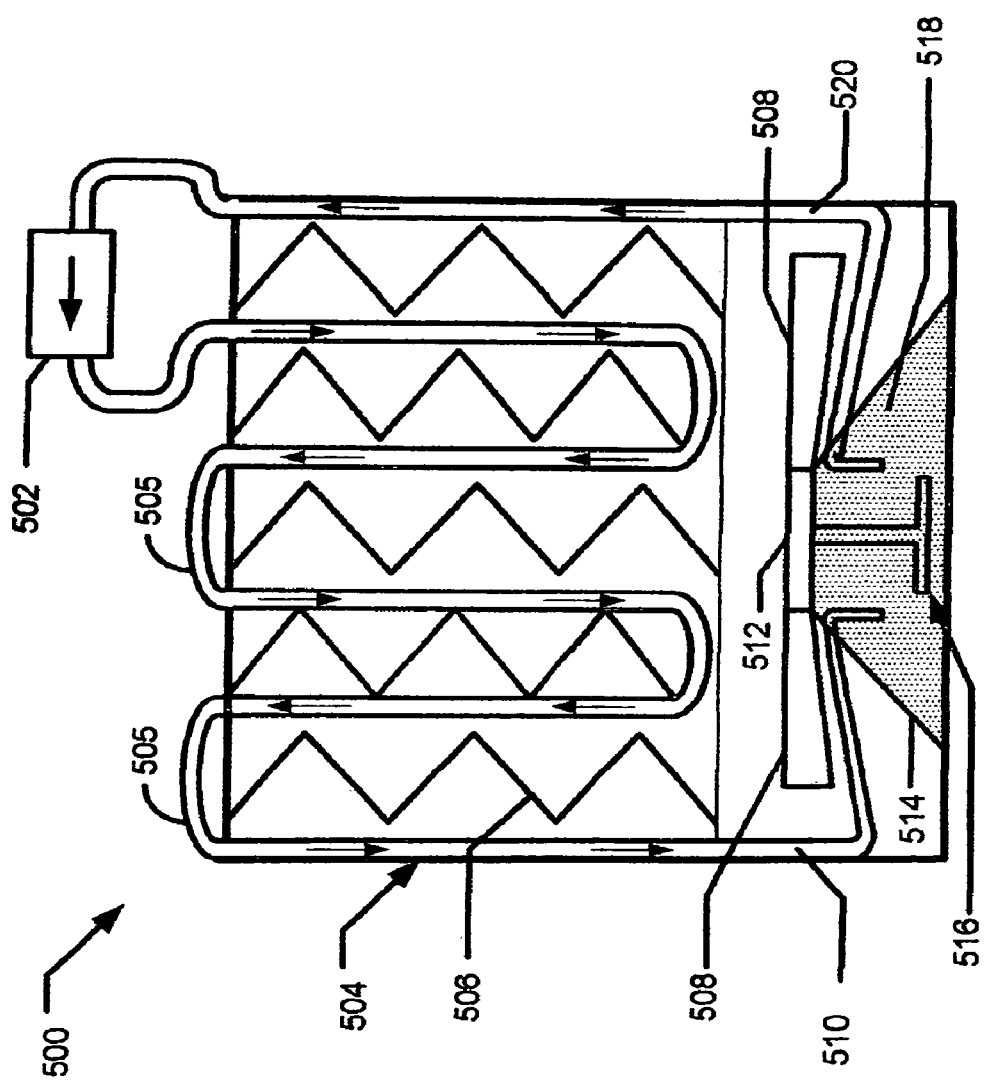
FIG. 5 displays a system view of another liquid cooling system suitable for use in a mobile computing environment, such as a Personal Digital Assistant (PDA), and implemented in accordance with the teachings of the present invention.

In addition to the heat transfer systems, heat exchange systems are presented. For example, a first heat exchange system is depicted in FIGS. 1 and 2; a second heat exchange system is depicted in FIG. 3; a fourth heat exchange system is depicted in FIG. 4; a fifth heat exchange system as depicted in FIG. 5. It should be appreciated that each of the foregoing heat exchange systems may be implemented with anyone of the foregoing heat transfer systems presented above.

In one embodiment of the present invention, a two-piece liquid cooling system is presented. The two-piece liquid cooling system includes: (1) a heat transfer system, which is capable of attachment to a processor, and (2) a heat exchange system. In one embodiment, a single conduit is used to couple the heat transfer system to the heat exchange system. In a second embodiment, a conduit transporting heated liquid and a conduit transporting cooled liquid are used to couple the heat transfer system to the heat exchange system. It should also be appreciated that the two-piece liquid cooling system may also be deployed as a one-piece liquid cooling system by deploying the heat transfer system and the heat exchange system in a single unit (i.e., a single consolidated embodiment).

The two-piece liquid cooling system utilizes several mechanisms to dissipate heat from a processor. In one embodiment, liquid is circulated in the two-piece liquid cooling system to dissipate heat from the processor. The liquid is circulated in two ways. In one embodiment, power is applied to the two-piece liquid cooling system and the liquid is pumped through the two-piece liquid cooling system to dissipate heat from the processor. For the purposes of this discussion, this is referred to as forced liquid circulation.

In a second embodiment, liquid input points and exit points are specifically chosen in the heat transfer system and the heat exchange system to take advantage of the heating and cooling of the liquid and the momentum resulting from the heating and cooling of the liquid. For the purposes of discussion, this is referred to as convective liquid circulation.

In another embodiment, aircooling is used in conjunction with the liquid cooling to dissipate heat from the processor. In one embodiment, the air-cooling is performed by strategically placing fans in the housing of the computing system. In a second embodiment, the air-cooling is performed by strategically placing a fan relative to the heat exchange system to increase the cooling performance of the heat exchange system. In yet another embodiment, heated air is expelled from the system during cooling to provide for a significant dissipation of heat.

FIG. 1 displays a system view of a liquid cooling system disposed in a housing and implemented in accordance with the teachings of the present invention. A housing or case 100 is shown. In one embodiment, the housing or case 100 may be a computer case, such as a standalone computer case, a laptop computer case, etc. In another embodiment, the housing or case 100 may include the case for a communication device, such as a cellular telephone case, etc. It should be appreciated that the housing or case 100 will include any case or containment unit, which houses a processor.

The housing or case 100 includes a motherboard 102. The motherboard 102 includes any board that contains a processor 104. A motherboard 102 implemented in accordance with the teachings of the present invention may vary in size and include additional electronics and processors. In one embodiment, the motherboard 102 may be implemented with a printed circuit board (PCB).

A processor 104 is disposed in the motherboard 102. The processor 104 may include any type of processor 104 deployed in a modem computing system. For example, the processor 104 may be an integrated circuit, a memory, a microprocessor, an optoelectronic processor, an application specific integrated circuit (ASIC), a field programmable gate array (FPGA), an optical device, etc., or a combination of foregoing processors.

In one embodiment, the processor 104 is connected to the heat transfer system 106 using a variety of connection techniques. For example, attachment devices, such as clips, pins, etc., are used to attach the heat transfer system 106 to the processor 104. In addition, mechanisms for providing for a quality contact (i.e., good heat transfer), such as epoxies, etc., may be disposed between the heat transfer system 106 and the processor 104 and are within the scope of the present invention.

The heat transfer system 106 includes a cavity (not shown in FIG. 1) through which liquid flows in a direction denoted by liquid direction arrow 122. In one embodiment, the heat transfer system 106 is manufactured from a material, such as copper, which facilitates the transfer of heat from the processor 104. In another embodiment, the heat transfer system 106 may be constructed with a variety of materials, which work in a coordinated manner to efficiently transfer heat away from the processor 104. It should be appreciated that the heat transfer system 106 and the processor 104 may vary in size. For example, in one embodiment, the heat transfer system 106 may be larger than the processor 104. A variety of heat transfer systems suitable for use as heat transfer system 106 are presented throughout the instant application. Many of the heat transfer systems are shown with a sectional view such as a view shown along sectional lines 138.

A conduit denoted by 108A/108B is connected to the heat transfer system 106. In one embodiment, the conduit 108A/108B may be built into the body of the heat transfer system 106. In another embodiment, the conduit 108A/108B may be connected and detachable from heat transfer system 106. In one embodiment, the conduit 108A/108B is a liquid pathway that facilitates the transfer of liquid from the heat transfer system 106.

A conduit 118A/118B is connected to the heat transfer system 106. In one embodiment, the conduit 118A/118B may be built into the body of the heat transfer system 106. In another embodiment, the conduit 118A/1188 may be connected and detachable from heat transfer system 106. In one embodiment, the conduit 118A/118B is a liquid pathway that facilitates the transfer of liquid to the heat transfer system 106.

In one embodiment, the conduit 108A/108B and the conduit 118A/118B may be combined into a single conduit coupling the heat transfer system 106 to the heat exchange system 112, where the single conduit transports both the heated and cooled liquid. In another embodiment, the conduit 108A/108B and the conduit 118A/118B may be combined into a single conduit coupling the heat transfer system 106 to the heat exchange system 112, where the single conduit is segmented into two conduits, one for transporting the heated liquid and one for transporting the cooled liquid. In addition, in one embodiment, an opening or liquid pathway transferring liquid directly between the heat transfer system 106 and the heat exchange system 112 without traversing any intermediate components (i.e., other than conduit connectors) may be considered a conduit, such as conduit 108A/108B and/or conduit 118A/118B. Both the conduit 108A/108B and the conduit 118A/118B may be made from a plastic material, metallic material, or any other material that would provide the desired characteristics for a specific application.

In one embodiment, the conduit 108A/108B includes three components: conduit 108A, connection unit 110, and conduit 108B. Conduit 108A is connected between the heat transfer system 106 and the connection unit 110. Conduit 108B is connected between connection unit 110 and heat exchange system 112. However, it should be appreciated that in one embodiment, a single uniform connection may be considered a conduit 108A/108B. In a second embodiment, the combination of conduit 108A, 110, and 108B may combine to form a single conduit.

In one embodiment, the conduit 118A/118B may also include three components: conduit 118B, connection unit 120, and conduit 118B. Conduit 118A is connected between the heat transfer system 106 and the connection unit 120. Conduit 118B is connected between connection unit 120 and heat exchange system 112. However, it should be appreciated that in one embodiment, a single uniform conduit may be considered a conduit 118A/118B. In a second embodiment, the combination of conduit 118A, connection unit 120, and conduit 118B may be combined to form a single conduit.

In one embodiment, a motor 114 is positioned relative to heat exchange system 112 to power the operation of the heat exchange system 112. A fan 116 is positioned relative to the heat exchange system 112 to move air denoted as 132 within the housing or case 100 and expel the air 132 through and/or around the heat exchange system 112 to the outside of the housing or case 100 as denoted by air 134. It should be appreciated that the fan 116 may be positioned in a variety of locations including between the heat exchange system 112 and the housing or case 100. In addition, in one embodiment, air vents 130 may be disposed at various locations within the housing or case 100.

In one embodiment, liquid is circulated in the liquid cooling system depicted in FIG. 1 to dissipate heat from processor 104. In one embodiment, the liquid (i.e., cooled liquid, heated liquid, etc.) is a non-corrosive, propylene glycol based coolant.

It should be appreciated that several two-piece liquid cooling systems are presented in the instant application. For example, heat transfer system 106 may be considered the first piece and heat exchange system 112 may be considered the second piece of a two-piece liquid cooling system. In another embodiment, heat transfer system 106 in combination with conduit 108A and conduit 118A may be considered the first piece of a two-piece liquid cooling system, and heat exchange system 112 in combination with conduit 108B and conduit 118B may be considered the second piece of a two-piece liquid cooling system. It should be appreciated that a number of elements of the liquid cooling system may be combined to deploy the liquid cooling system as a two-piece liquid cooling system. For example, the motor 114 may be combined with the heat exchange system 112 to produce one piece of a two-piece liquid cooling system.

During operation, cooled liquid as depicted by direction arrows 128 is transported in the conduit 118A/118B to the heat transfer system 106. The cooled liquid 128 in the conduit 118A/118B moves through a cavity in the heat transfer system 106 as shown by liquid direction arrow 122. In one embodiment, the heat transfer system 106 transfers heat from the processor 104 to the liquid denoted by direction arrow 122. Heating the liquid in the heat transfer system 106 with the heat from the processor 104 transforms the cooled liquid 128 to heated liquid. It should be appreciated that the terms cooled liquid and heated liquid are relative terms as used in this application and represent a liquid that has been cooled and a liquid that has been heated, respectively. The heated liquid is then transported on conduits 108A/108B as depicted by directional arrows 124. In one embodiment of the present invention, the cooled liquid 128 enters the heat transfer system 106 at a lower point than the exit point for the heated liquid depicted by directional arrows 124. As a result, as the cooled liquid 128 is heated it becomes lighter and rises in the heat transfer system 106. This creates liquid movement, liquid momentum, and liquid circulation (i.e., convective liquid circulation) in the liquid cooling system.

The heated liquid 124 is transported through conduit 108A/108B to the heat exchange system 112. The heated liquid depicted by directional arrows 124 enters the heat exchange system 112 through conduit 108B. The heated liquid 124 has liquid momentum as a result of being heated and rising in the heat transfer system 106. It should be appreciated that the circulation of the heated liquid 124 is also aided by the pump assembly (not shown) associated with the heat exchange system 112. The heated liquid 124 then flows through the heat exchange system 112 as depicted by directional arrows 126. As the heated liquid 124 flows through the heat exchange system 112, the heated liquid 124 is cooled. As the heated liquid 124 is cooled, the heated liquid 124 becomes heavier and falls to the bottom of the heat exchange system 112. The cooler, heavier liquid falling to the bottom of the heat exchange system 112 also creates liquid movement, liquid momentum, and liquid circulation (i.e., convective liquid circulation) in the system. The cooled liquid 128 then exits the heat exchange system 112 through the conduit 118B.

As a result, in one embodiment of the present invention, liquid circulation is created by: (1) heating cooled liquid 128 in heat transfer system 106 and then (2) cooling heated liquid 124 in heat exchange system 112. In both scenarios, liquid is introduced at a certain position in the heat transfer system 106 and the heat exchange system 112 to create the momentum (i.e. convective liquid circulation) resulting from heating and cooling of the liquid. For example, in one embodiment, cooled liquid 128 is introduced in the heat transfer system 106 at a position that is below the position that the heated liquid 124 exits the heat transfer system 106. Therefore, conduit 118A, which transports cooled liquid 128 to heat transfer system 106 is positioned below conduit 108A which transports the heated liquid 124 away from the heat transfer system 106. As a result, after the cooled liquid 128 transported and introduced into the heat transfer system 106 by conduit 118A is transformed to heated liquid 124, the lighter heated liquid 124 rises in the heat transfer system 106 and exits through conduit 108A which is positioned above conduit 118A. In one embodiment, positioning conduit 108A above conduit 118A enables conduit 108A to receive and transport the lighter-heated liquid 124, which rises in the heat transfer system 106.

A similar scenario occurs with the heat exchange system 112. The conduit 108B, which transports the heated liquid 124, is positioned above the conduit 118B, which transports the cooled liquid 128. For example, in one embodiment, conduit 108B is positioned at the top portion of the heat exchange system 112. Therefore, heated liquid 124 is introduced into the top of the heat exchange system 112. As the heated liquid 124 cools in heat exchange system 112, the heated liquid 124 becomes heavier and falls to the bottom of the heat exchange system 112. A conduit 118B is then positioned at the bottom of the heat exchange system 112 to receive and transport the cooled liquid 128.

In addition to the convective liquid circulation occurring as a result of the positioning of inlet and outlet points in the heat transfer system 106 and the heat exchange system 112, a pump (not shown in FIG. 1) is also used to circulate liquid within the liquid cooling system. For the purposes of discussion, the liquid circulation resulting from the use of power (i.e., the pump) may be called forced circulation. Therefore, processor heat dissipation is accomplished using convective liquid circulation and forced circulation.

In addition to circulating liquid within the liquid cooling system, a fan 116 is used to move air across, around, and through the heat exchange system 112. In one embodiment, the fan 116 is positioned to move air through and around the heat exchange system 112 to create substantial additional liquid cooling with the heat exchange system 112. In another embodiment, air (i.e., depicted by 132) heated within the housing or case 100 is expelled outside of the housing or case 100 as depicted by 134 to provide additional heat dissipation.

In one embodiment, each of the methods, such as convective liquid circulation, forced liquid circulation, delivering air through the heat exchange system 112, and expelling air from within the housing or case 100, may each be used separately or in combination. As each technique is combined or added in combination, an exponentially increasing amount of heat dissipation is achieved.

FIG. 2 displays a sectional view of a heat exchange system implemented in accordance with the teachings of the present invention. FIG. 2 displays a sectional view of heat exchange system 112 along section line 140 shown in FIG. 1. A cross section of the motor 114 is shown. The motor 114 is positioned above heat exchange system 112; however, the motor 114 may be positioned on the sides or on the bottom of heat exchange system 112. Further, heat exchange system 112 may be deployed without the motor 114 and derive power from another location in the system.

Heat exchange system 112 includes an input cavity 200, a heat dissipater 210, and an output cavity 212. In one embodiment, the motor 114 is connected through a shaft 202 to an impeller 216, disposed in an impeller case 214. In one embodiment, the input cavity 200 is connected to the conduit 108B. In another embodiment, an impeller case 214, an impeller casing input 220, and an impeller exhaust 218 are positioned within the output cavity 212. The impeller exhaust 218 is connected to the conduit 118B. Further, in one embodiment, liquid tubes 208 run through the length of the heat dissipater 210 and transport liquid from the input cavity 200 to the output cavity 212. In yet another embodiment, heat exchange system 112 may be fitted with a snap-in unit for easy connection to housing or case 100 of FIG. 1.

In one embodiment, the input cavity 200, the heat dissipater 210, and the output cavity 212 may be made from metal, metallic compounds, plastics, or any other materials that would optimize the system for a particular application. In one embodiment, the input cavity 200 and the output cavity 212 are connected to the heat dissipater 210 using solder, adhesives, or a mechanical attachment. In another embodiment, the heat dissipater 210 is made from copper. In yet another embodiment, the heat dissipater 210 could be made from aluminum or other suitable thermally conductive materials. For example, the fin units 204 may be made from copper, aluminum, or other suitable thermally conductive materials.

Although straight liquid tubes 208 are shown in FIG. 2, serpentine, bending, and flexible liquid tubes 208 are contemplated and within the scope of the present invention. In one embodiment, the liquid tubes 208 may be made from metal, metallic compounds, plastics, or any other materials that would optimize the system for a particular application. The liquid tubes 208 are opened on both sides to receive heated liquid from the input cavity 200 and to output cooled liquid to the output cavity 212. In one embodiment, the liquid tubes 208 are designed to encourage non-laminar flow of liquid in the tubes. As such, more effectively cooling of the liquid is accomplished.

In one embodiment, a shaft 202 runs through the input cavity 200, through the heat dissipater 210 (i.e., through a liquid tube 208), to the output cavity 212. It should be appreciated that the shaft 202 may be made from a variety of materials, such as metal, metallic compounds, plastics, or any other materials that would optimize the system for a particular application.

The heat dissipater 210 includes a plurality of liquid tubes 208 and fin units 204 including fins 206. The liquid tubes 208, fin units 204, and fins 206 may each vary in number, size, and orientation. For example, the fins 206 maybe straight as displayed in FIG. 2, bent into an arch, etc. In addition, fins 206 may be implemented with a variety of angular bends, such as 45-degree angular bends. Further, the fins 206 are arranged to produce non-laminar flow of the air stream as the air denoted as 132 of FIG. 1 transition through the fins 206 to the air denoted by 134 of FIG. 1.

The motor 114 is positioned on one end of the shaft 202 and an impeller 216 is positioned on an oppositely disposed end of the shaft 202. In one embodiment, the motor 114 may be implemented with a brushless direct current motor; however, other types of motors, such as AC induction, AC, or DC servo-motors, may be used. Further, different types of motors that are capable of operating a pump are contemplated and are within the scope of the present invention.

In one embodiment, the pump is implemented with an impeller 216. However, it should be appreciated that other types of pumps may be deployed and are in the scope of the present invention. For example, inline pumps, positive displacement pumps, caterpillar pumps, and submerged pumps are contemplated and within the scope of the present invention. The impeller 216 is positioned within an impeller case 214. In one embodiment, the impeller 216 and the impeller case 214 are positioned in an output cavity 212. However, it should be appreciated that in an alternate embodiment, the impeller 216 and the impeller case 214 may be positioned outside of the output cavity 212 at another point in the liquid cooling system. In a second embodiment, the pump is deployed at the bottom of the output cavity 212 and as such is self-priming.

During operation, heated liquid is received in the input cavity 200 from the conduit 108B. The heated liquid is distributed across the liquid tubes 208 and flow through the liquid tubes 208. As the heated liquid flows through the liquid tubes 208, the heated liquid is cooled by the fin units 204 that transform the heated liquid into cooled liquid. The cooled liquid is then deposited in the output cavity 212 from the liquid tubes 208. As the shaft 202 rotates, the impeller 216 operates and draws the cooled liquid into the impeller case 214. The cooled liquid is then transported out of the impeller case 214 and into the conduit 118B by the impeller 216.

It should be appreciated that in one embodiment of the present invention, the conduit 108B is positioned above the heat dissipater 210 and above the output cavity 212. As such, as the heated liquid received in input cavity 200 flows through the heat dissipater 210, the heated liquid is transformed into cooled liquid, which is heavier than the heated liquid. The heavier-cooled liquid then falls to the bottom of the heat dissipater 210 and is deposited in the output cavity 212. The heavier-cooled liquid is output through the conduit 118B using the impeller 216. In addition, in an alternate embodiment, when the impeller 216 is not operating, the movement of the heavier-cooled liquid generates momentum (i.e., convective liquid circulation) in the liquid cooling system of FIG. 1 as the cooled liquid moves from the input cavity 200, through the heat dissipater 210 to the output cavity 212.

In one embodiment, air flows over the fin 204 and through the fins 206 to provide additional cooling of liquid flowing through the liquid tubes 208. For example, using FIG. 1 in combination with FIG. 2, air is generated by fan 116 and flows through the fin units 204 and fins 206 to provide additional cooling by cooling both the fin units 204 and the liquid flowing in the liquid tubes 208.

FIG. 3 displays a system view of an embodiment of a liquid cooling system disposed in a housing and implemented in accordance with the teachings of the present invention. A data processing and liquid cooling system is depicted. The data processing and liquid cooling system comprises a housing 300 (e.g., a computer cabinet or case) and a processor 302 (e.g., a processing unit, CPU, microprocessor) disposed within housing 305. The data processing and liquid cooling system 300 further comprises a heat transfer system 304 engaged with one or more surfaces of a processor 302, a transport system 307, and a heat exchange system 310. It should be appreciated that a variety of heat transfer systems 304 implemented in accordance with the teachings of the present invention may be used as heat transfer system 304.

A liquid coolant is circulated through heat transfer system 304 as indicated by flow indicators 301 and by transport system 307. Transport system 307 delivers cooled liquid from and returns heated liquid to heat exchange system 310.

More specifically, as the processor 302 functions, it generates heat. In the case of a typical processor 302, the heat generated can easily reach destructive levels. This heat is typically generated at a rate of a certain amount of BTU per second. Heating usually starts at ambient temperature and continues to rise until reaching a maximum. When the machine is turned off, the heat from processor 302 will peak to an even higher maximum. This temperature peak can be so high that a processor 302 will fail. This failure may be permanent or temporary. With the present invention, this temperature peak is virtually eliminated. Operation at higher system speeds will amplify this effect even more. With the present invention, however, processor 302 is cooled to within a few degrees of room temperature. In addition, processor 302 will remain within a few degrees of room temperature after system shut down.

Depending upon specific design constraints and criteria, heat transfer system 304 may be coupled to processor 302 in a number of ways. As depicted, heat transfer system 304 is engaged with the top surface of processor 302. This contact may be established using, for example, a thermal epoxy, a dielectric compound, or any other suitable contrivance that provides direct and thorough transfer of heat from the surface of processor 302 to the heat transfer system 304. A thermal epoxy may be used to facilitate the contact between processor 302 and heat transfer system 304. Optionally, the epoxy may have metal casing disposed within to provide better heat removal. Alternatively, a silicon dielectric may be utilized. Alternatively, mechanical fasteners (e.g., clamps or brackets) may be used, alone or in conjunction with epoxy or dielectric, to adjoin the units in direct contact. Other methods can be used or a combination of the methods can be used. Further, it should be appreciated that the heat transfer system 304 may be attached to any part of the processor 302 and still remain within the scope of the present invention.

In an embodiment, liquid cooling system 300 represents an application of the present invention in larger data processing systems, such as personal computers or server equipment. Heat exchange system 310 comprises a coolant reservoir 314 and a heat exchange system 330 coupled together by liquid conduit 328. Liquid cooling system 300 further comprises conduit 308, which couples coolant reservoir 314 to transfer system 304. Liquid cooling system 300 further comprises conduit 306, which couples heat exchange system 310 to the heat transfer system 304. Conduit 308 transports cooled liquid 320 from coolant reservoir 314 to the heat transfer system 304. Liquid conduit 306 receives and transfers heated liquid from the heat transfer system 304 to heat exchange system 310. Conduit 328 transports cooled liquid from heat exchange system 330 back to coolant reservoir 314. Conduits 306, 308, and 328 may comprise a number of suitable rigid, semi-rigid, or flexible materials (e.g., copper tubing, metallic flex tubing, or plastic tubing) depending upon desired cost and performance characteristics. Conduits 306, 308, and 328 may be inter-coupled or joined with other system components using any appropriate permanent or temporary contrivances (e.g., such as soldering, adhesives, or mechanical clamps).

Coolant reservoir 314 receives and stores cooled liquid 320 from conduit 328. Cooled liquid 320 is a non-corrosive, low-toxicity liquid, resilient and resistant to chemical breakdown after repeated usage while providing efficient heat transfer and protection against corrosion. Depending upon particular cost and design criteria, a number of gases and liquids may be utilized in accordance with the present invention (e.g., propylene glycol). Coolant reservoir 314 is a sealed structure appropriately adapted to house conduits 328 and 308. Coolant reservoir 314 is also adapted to house a pump assembly 316. Pump assembly 316 may comprise a pump motor 312 disposed upon an upper surface of coolant cavity 314 and an impeller assembly 324 which extends from the pump motor 312 to the bottom portion of coolant reservoir 314 and into cooled liquid 320 stored therein. The portion of delivery conduit 308 within coolant reservoir 314 and pump assembly 316 are adapted to pump cooled liquid 320 from coolant reservoir 314 into and along conduit 308. In one embodiment, pump assembly 316 includes a motor 312, a shaft 322 and an impeller 324. Conduit 308 may be directly coupled to pump assembly 316 to satisfy this relationship or conduit 308 may be disposed proximal to impeller assembly 324 such that the desired pumping is effected.

Heat exchange system 330 receives heated liquid via conduit 306. Heat exchange system 330 may be formed or assembled from a suitable thermal conductive material (e.g., brass or copper). Heat exchange system 330 comprises one or more chambers, coupled through a liquid path (e.g., heat dissipater 332 consisting of canals, tubes). Heated liquid is received from conduit 306 and transported through heat exchange system 330 leaving heat exchange system 330 through conduit 328. The liquid flows through the chambers of heat exchange system 330 thereby transferring heat from the liquid to the walls of heat exchange system 330 may further comprise one or more heat dissipaters 332 to enhance heat transfer from the liquid as it flows through heat dissipater 332 disposed in heat exchange system 330. Heat dissipater 332 comprises a structure appropriate to affect the desired heat transfer (e.g. rippled fins). In one embodiment, an attachment mechanism 334 connects heat transfer system (310 & 330) to casing 305 for further dissipation of heat. A more thorough discussion of the liquid cooling system 300 depicted in FIG. 3 may be derived from U.S. Pat. No. 6,529,376, entitled "System Processor Heat Dissipation," issued on Mar. 4, 2003, which is herein incorporated by reference.

FIG. 4A displays a system view of a liquid cooling system suitable for use in a mobile computing environment, such as a laptop, and implemented in accordance with the teachings of the present invention. The material, selection, and scale of the elements of liquid cooling system 400 are adjusted according to the particular cost size and performance criteria of the particular application. A heat transfer system is shown as 420. The heat transfer system 420 is coupled to the heat exchange system 406 by conduits 402 and 418.

Conduit 418 transports cooled liquid 414 from the heat exchange system 406 to the heat transfer system 420. Conduit 402 receives and transfers heated liquid from the heat transfer system 420 and transfers the heated liquid shown as 404 to the heat exchange system 406. In one embodiment, conduit 402 and conduit 418 may comprise a number suitable rigid, semi-rigid, or flexible materials. (e.g., copper tubing, metal flex tubing, or plastic tubing) depending on desired costs and performance characteristics required. Conduit 402 and conduit 418 may be inter-coupled or joined with other system components using any appropriate permanent or temporary connection mechanism, such as soldering, adhesives, mechanical clamps, or any combination thereof.

Heat transfer system 420 includes a cavity (not shown in FIG. 4A). Heat transfer system 420 receives cooled liquid from conduit 418. The cooled liquid is a non-corrosive, low-toxicity liquid, resilient and resistant to chemical breakdown after repeated usage while providing efficient heat transfer. Depending upon particular cost and design criteria, a number of gases and liquids may be utilized in accordance with the present invention (e.g., propylene glycol).

During operation, the fan 416 blows air over the fins 412. The air keeps the fins 412 cool which in turn cool the liquid in liquid flow tubes 410. A pump (not shown in FIG. 4A) disposed in the heat transfer system 420 drives liquid around in the system. Cooled liquid enters the heat transfer system 420 and heated liquid exits the heat transfer system 420. A conduit 402 transfers the heated liquid shown as 404 to heat exchange system 406. The heated liquid flows through the liquid flow tubes 410 and is cooled by the fins 412 and the air flowing from the fan 416. Cooled liquid 414 then exits the heat exchange system 406 and is conveyed on conduit 418 to the heat transfer system 420.

FIG. 4B displays a cross-sectional view of heat exchange system 406 along sectional lines 408 of FIG. 4A. In FIG. 4B, the liquid flow tubes 410 are shown surrounded by the fins 412. It should be appreciated that the fins 412 may be deployed in a variety of different configurations and still remain within the scope of the present invention.

FIG. 5 displays a system view of another liquid cooling system suitable for use in a mobile computing system, such as a Personal Data Assistant (PDA), and implemented in accordance with the teachings of the present invention. Liquid cooling system 500 represents an application of the present invention in smaller handheld applications, such as palmtop computers, cell phones, or PDAs. The material selection and scale of the elements of liquid cooling system 500 are adjusted according to the particular cost, size, and performance criteria of the particular application. Liquid cooling system 500 includes a heat transfer system 502 and a heat exchange system 504. Cooled liquid is communicated from the heat exchange system 504 to the heat transfer system 502 through a conduit 520. Heated liquid is transferred from the heat transfer system 502 to the heat exchange system 504 through the conduit 510.

The heat exchange system 504 includes liquid flow tubes 505 for conveying and cooling liquid. Fins 506 are interspersed between the liquid flow tubes 505. However, it should be appreciated that a variety of configurations may be implemented and still remain within the scope of the present invention. For example, the liquid flow tubes 505 may take a variety of horizontal, vertical, and serpentine configurations. In addition, the fins 506 may be deployed as vertical fins, horizontal fins, etc. Lastly, the fins 506 and liquid flow tubes 505 may be deployed relative to each other, in a manner that maximizes cooling of liquid flowing through the liquid flow tubes 505.

In one embodiment, the fins 506 in combination with the liquid flow tubes 505 may be considered a heat dissipater. In another embodiment, the fins 506 may be considered a heat dissipater. Yet in another embodiment, the liquid flow tubes 505 positioned to receive air flowing over the liquid flow tubes 505 may be considered a heat dissipater.

A motor 512 is also positioned in the heat exchange system 504. The motor 512 and the cavity 514 form a sealed cavity for seal that retains liquid 518. The motor 512 is connected to an impeller 516, which is deployed in the cavity 514. In one embodiment, the motor 512 in combination with the impeller 516 is considered a pump. In another embodiment, the impeller 516 is considered a pump. Conduit 510 brings cooled liquid into the cavity 514 and conduit 520 removes the cooled air from the cavity 514.

Conduits 510 and 520 may comprise a number of suitable rigid, semi-rigid, or flexible materials (e.g., copper tubing, metallic flex tubing, or plastic tubing) depending upon desired cost and performance characteristics. Conduits 510 and 520 may be incorporated or joined with other system components using any appropriate permanent or temporary contrivances (e.g., such as soldering, adhesives, mechanical clamps, or any combination thereof).

Cavity 514, which acts as a reservoir, receives and stores cooled liquid. Liquid 518 is a non-corrosive, low-toxicity liquid, resilient and resistant to chemical breakdown after repeated usage while providing efficient heat transfer and corrosion prevention. Depending upon particular cost and design criteria, a number of gases and liquids may be utilized in accordance with the present invention (e.g., propylene glycol). Cavity 514 is a sealed structure appropriately adapted to house conduits 510 and 520.

Depending upon a particular application, liquid cooling system 500 may further comprise one or more airflow elements 508 disposed within liquid cooling system 500 to effect desired heat transfer. As depicted, airflow elements 508 may comprise fan blades coupled to motor 512, adapted to provide air circulation as motor 512 operates. Alternatively, liquid cooling system 500 may comprise separate airflows assemblies disposed and adapted to provide or facilitate an airflow that enhances desired heat transfer.

During operation, motor 512 operates and airflow elements 508 revolve. The revolving airflow elements 508 affect airflow through the heat exchange system 504 and cool the fins 506. In addition, the airflow cools the liquid 518 in the cavity 514. In one embodiment, the airflow elements 508 produce 514. The motor 512 also drives impeller 516, which performs an intake function, and transfers cooled liquid 518 through conduit 520 to the heat transfer system 502. The cooled liquid 518 is heated in heat transfer system 502 and transferred to heat exchange system 504. As the heated liquid flows through liquid flow tubes 505, the heated liquid is cooled and becomes cooled liquid as a result of the airflow on the fins 506 and the airflow over the liquid flow tubes 505.

Although the heat transfer system 502 is positioned in a specific orientation in FIG. 5, in one embodiment of the present invention, the heat transfer system 502 is positioned so that cooled air comes into the bottom of heat transfer system 502 and heated air exits through the top of heat transfer system 502.

Figure 6:
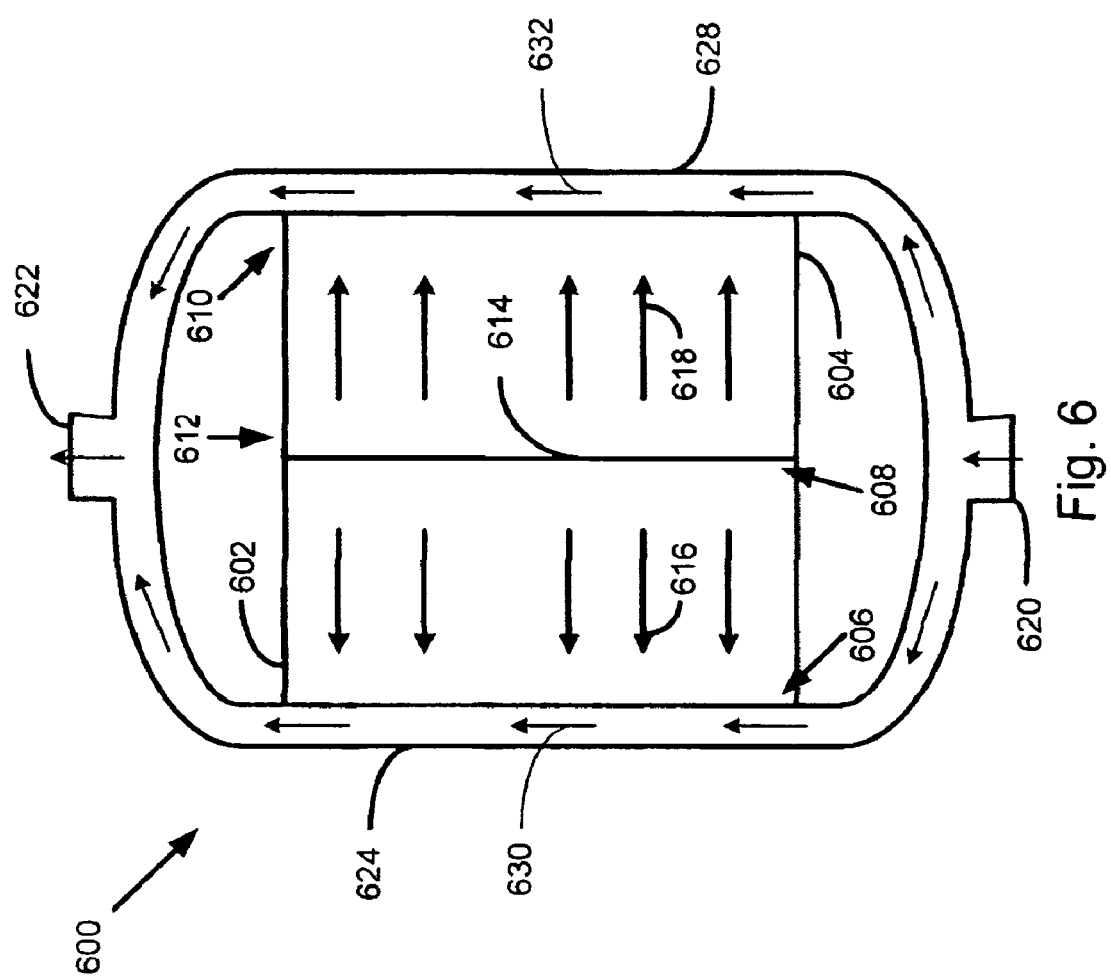
FIG. 6 displays a top view of an embodiment of a heat transfer system such as a Solid-state system, and implemented in accordance with the teachings of the present invention.

FIG. 6 displays a top view of an embodiment of a heat transfer system, such as a solid-state system implemented in accordance with the teachings of the present invention. A heat transfer system 600 is shown. In one embodiment, the heat transfer system 600 is implemented as an electron conducting material. The electron conducting material may be a material, which transfers electrons when an electric current is applied. In one embodiment of the present invention, the electron conducting material is implemented with semiconductor materials, metal material, etc. A first electron conducting material 602 and a second electron conducting material 604 are shown. The electron conducting materials 602 and 604 may be implemented with a variety of semiconductor materials, such as silicon, germanium, etc. and still remain within the scope of the present invention. Further, the electron conducting materials 602 and 604 may be implemented with a mixture of semiconductor materials or a combination of semiconductor materials and other materials and still remain within the scope of the present invention. In another embodiment, the electron conducting materials 602 and 604 may be implemented as highly doped semiconductor materials. In yet another embodiment of the present invention, the electron conducting materials 602 and 604 may include two conducting materials, which are different.

In one embodiment, the first electron conducting material 602 and the second electron conducting material 604 have a different molecular composition and may represent different semiconductor materials. In an alternative embodiment, the first electron conducting material 602 and the second electron conducting material 604 may represent the semiconductor material doped with different amounts of electrons.

The first electron conducting material 602 and the second electron conducting material 604 are connected at a junction 614. In addition, electrical current is applied to both the first electron conducting material 602 and the second electron conducting material 604. In one embodiment, the electrical current is applied at a first polarity causing the migration of electrons in one direction.

In one embodiment, the first electron conducting material 602 and the second electron conducting material 604 are configured so that when current is applied to the first electron conducting material 602 and the second electron conducting material 604, the first electron conducting material 602 and the second electron conducting material 604 experience the peltier effect. In another embodiment, the electron conducting materials 602 and 604 may be implemented to form a thermoelectric cooler, a peltier cooler, a solid-state refrigerator, a solid-state heat pump, a micro cooler, etc., or function as a thermoelectric system.

In one embodiment, the electron conducting materials 602 and 604 are subject to the peltier effect. As such, as current is applied to the first electron conducting material 602, electrons migrate across the first electron conducting material 602 as shown by directional arrows 616. Therefore, a cool region 608 develops at the junction 614 and a hot region 606 develops in the direction of the electrons migration 616. In a similar manner, as current is applied to the second electron conducting material 604, electron migrates across the second electron conducting material 604 as shown by directional arrows 618. Therefore, a cool region 612 develops at the junction 614 and a hot region 610 develops in the direction of the electrons migration 618.

As the electrons migrate as shown by directional arrows 616 and 618, the hot regions 606 and 610 continue to develop. Conduit 624 is connected to the hot region 606 of first electron conducting material 602. Cooled liquid enters through inlet 620 and is conveyed on conduit 624 as shown by directional arrow 630. Conduit 628 is connected to hot region 610 of second electron conducting material 604. The cooled liquid 630 then exits conduit 624 through outlet 622. Cooled liquid enters through inlet 620 and is conveyed on conduit 628 as shown by directional arrows 632. The cooled liquid 632 then exits conduit 628 through outlet 622.

During operation, electrical current is applied to first electron conducting material 602 and to second electron conducting material 604. As such, electrons migrate away from the junction 614. The electrons migrate in a direction shown by directional arrows 616 and 618. As the electrons migrate away from junction 614, a cold region 608 develops in first electron conducting material 602 and a cold region 612 develops in second electron conducting material 604. In addition, in the direction that the electrons migrate (i.e., 616), a hot region 606 develops in first electron conducting material 602. In the direction that the electrons migrate (i.e., 618), a hot region 610 develops in second electron conducting material 604.

Cooled liquid shown by directional arrows 630 and 632 enters conduits 624 and 628 through inlet 620. As the cooled liquids 630 and 632 are transported in conduits 624 and 628, the cooled liquids 630 and 632 dissipate heat from the hot regions 606 and 610. For example, as cooled liquid 630 is conveyed in conduit 624, the heat generated in hot region 606 is lowered and hot region 606 becomes cooler. In addition, the cooled liquid 630 becomes heated liquid and heated liquid is output from the outlet 622. As the cooled liquid 632 is conveyed in conduit 628, the heat generated in hot region 610 is lowered and hot region 610 becomes cooler. In addition, the cooled liquid 632 becomes heated liquid and heated liquid is output from the outlet 622.

In one embodiment of the present invention, conduits 624 and 628 are formed within or formed from the electron conducting materials. In a second embodiment, conduits 624 and 628 are bonded to the electron conducting materials. It should be appreciated that conduits 624 and 628 may be implemented with any material that may be configured to transfer heat from the electron conducting materials.

FIG. 7A displays a bottom view of an embodiment of a heat transfer system 700. The first electron conducting material 702 and the second electron conducting material 704 are connected at a junction 714. In addition, electrical current is applied to both the first electron conducting material 702 and the second electron conducting material 704. In one embodiment, the electrical current is applied at a first polarity. Applying the electrical current in a second polarity which is opposite from the first polarity will cause the electron current flow in first electron conducting material 702 and the electron flow in second electron conducting material 704 to change directions.

In one embodiment, the first electron conducting material 702 and the second electron conducting material 704 are configured so that when current is applied to the first electron conducting material 702 and the second electron conducting material 704, the first electron conducting material 702 and the second electron conducting material 704 experience the peltier effect. As such, as current is applied to the first electron conducting material 702, electrons migrate across the first electron conducting material 702 as shown by directional arrows 716. Therefore, a cool region 708 develops at the junction 714 and a hot region 706 develops in the direction of the electrons migration 716. In a similar manner, as current is applied to the second electron conducting material 704, electrons migrate across the second electron conducting material 704 as shown by directional arrows 718. Therefore, a cool region 712 develops at the junction 714 and a hot region 710 develops in the direction of the electrons migration 718.

As the electrons migrate as shown by directional arrows 716 and 718, the hot regions 706 and 710 continue to develop. Conduit 724 is connected to the hot region 706 of first electron conducting material 702. Cooled liquid enters through inlet 720 and is conveyed on conduit 724 as shown by directional arrow 730. The cooled liquid 730 then exits conduit 724 through outlet 722. Conduit 728 is connected to hot region 710 of second electron conducting material 704. Cooled liquid enters through inlet 720 and is conveyed on conduit 728 as shown by directional arrows 732. The cooled liquid 732 then exits conduit 728 through outlet 722.

A processor is shown as 734. In one embodiment, the processor 734 includes a semiconductor device including packaging material. In another embodiment, the processor 734 includes a semiconductor device without packaging material. It should be appreciated that in one embodiment of the present invention, the cold region 708 gradually transitions into the hot region 706 and the cold region 712 gradually transitions into the hot region 710. However, in one embodiment of the present invention, the processor 734 is positioned at the junction 714 toward the cold region 708 of the first electron conducting material 702 and toward the cold region 712 of the second electron conducting material 704. The processor 734 generates heat.

It should be appreciated that in a second embodiment, a single electron conducting material, such as 702 or 704, may be used to engage a processor, such as 734. In one embodiment, the single electron conducting material 702 or 704 would contact the processor 734 on the cold region 708 or 712.

During operation, electrical current is applied to first electron conducting material 702 and to second electron conducting material 704. As such, electrons migrate away from the junction 714. The electrons migrate in a direction shown by directional arrows 716 and 718. As the electrons migrate away from junction 714, a cold region 708 develops in first electron conducting material 702 and a cold region 712 develops in second electron conducting material 704. In addition, in the direction that the electrons migrate (i.e., 716), a hot region 706 develops in first electron conducting material 702. In the direction that the electrons migrate (i.e., 718), a hot region 710 develops in second electron conducting material 704.

Cooled liquid shown by directional arrows 730 and 732 enters conduits 724 and 728 through inlet 720. As the cooled liquids 730 and 732 are transported in conduits 724 and 728, the cooled liquids 730 and 732 dissipate heat from the hot regions 706 and 710. For example, as cooled liquid 730 is conveyed in conduit 724, the heat generated in hot region 706 is lowered and hot region 706 becomes cooler. In addition, the cooled liquid 730 becomes heated liquid and heated liquid is output from the outlet 722. As the cooled liquid 732 is conveyed in conduit 728, the heat generated in hot region 710 is lowered and hot region 710 becomes cooler. In addition, the cooled liquid 732 becomes heated liquid and heated liquid is the output from the outlet 722.

The processor 734 generates heat. Since the processor 734 is positioned at the junction 714 within the cold region 708 of the first electron conducting material 702 and within the cold region 712 of the second electron conducting material 704 as the processor 734 generates the heat, the cold region 708 of the first electron conducting material 702 and the cold region 712 of the second electron conducting material 704 absorb the heat. As the cold region 708 of the first electron conducting material 702 and the cold region 712 of the second electron conducting material 704 absorb the heat from the processor 734, the heat is dissipated from the processor 734. In addition, as the cold region 708 of the first electron conducting material 702 and the cold region 712 of the second electron conducting material 704 absorb the heat from the processor 734, the heat migrates toward the hot region 706 of the first electron conducting material 702 and toward the hot region 710 of the second electron conducting material 704 as depicted by electrons migration flow arrows 716 and 718. In one embodiment of the present invention, it should be appreciated that the terms cold and hot are relative to each other, where the cold region is colder than the hot region and the hot region is hotter than the cold region.

As heat dissipates from the processor 734 into the cold regions 708 and 712, the cold regions 708 and 712 absorb the heat and increase in temperature (i.e., become hotter). The heat migrates from the cold regions 708 and 712 to the hot regions 706 and 710, respectively. As the heat migrates to the hot regions 706 and 710, the hot regions 706 and 710 become hotter.

The conduits 724 and 728 convey cooled liquid shown by directional arrows 730 and 732. The liquid enters inlet 720 as cooled liquids 730 and 732. As the cooled liquids 730 and 732 are conveyed in conduits 724 and 728 past the hot regions 706 and 710, the cooled liquids 730 and 732 are heated in the conduits 724 and 728. The cooled liquids 730 and 732 dissipate the heat from the hot regions 706 and 710. As a result, the cooled liquids 730 and 732 become heated liquid. The heated liquid exits conduits 724 and 728 through outlet 722. As a result, during operation, heat is first transferred from the processor 734 to the cold regions 708 and 712. As a result, the processor 734 dissipates heat into the cold regions 708 and 712 and the processor 734 is cooled. The heat then migrates to the hot regions 706 and 710. The heat migrates from the hot regions 706 and 710 to the cooled liquids 730 and 732 flowing in the conduits 724 and 728. As a result, the cooled liquids 730 and 732, which entered conduits 724 and 728 through inlet 720, are heated and exit conduits 724 and 728 through outlet 722 as heated liquid. Transferring the heat from the hot regions 706 and 710 also has the effect of cooling the hot regions 706 and 710 and dissipating heat in the hot regions 706 and 710.

Figure 7B:
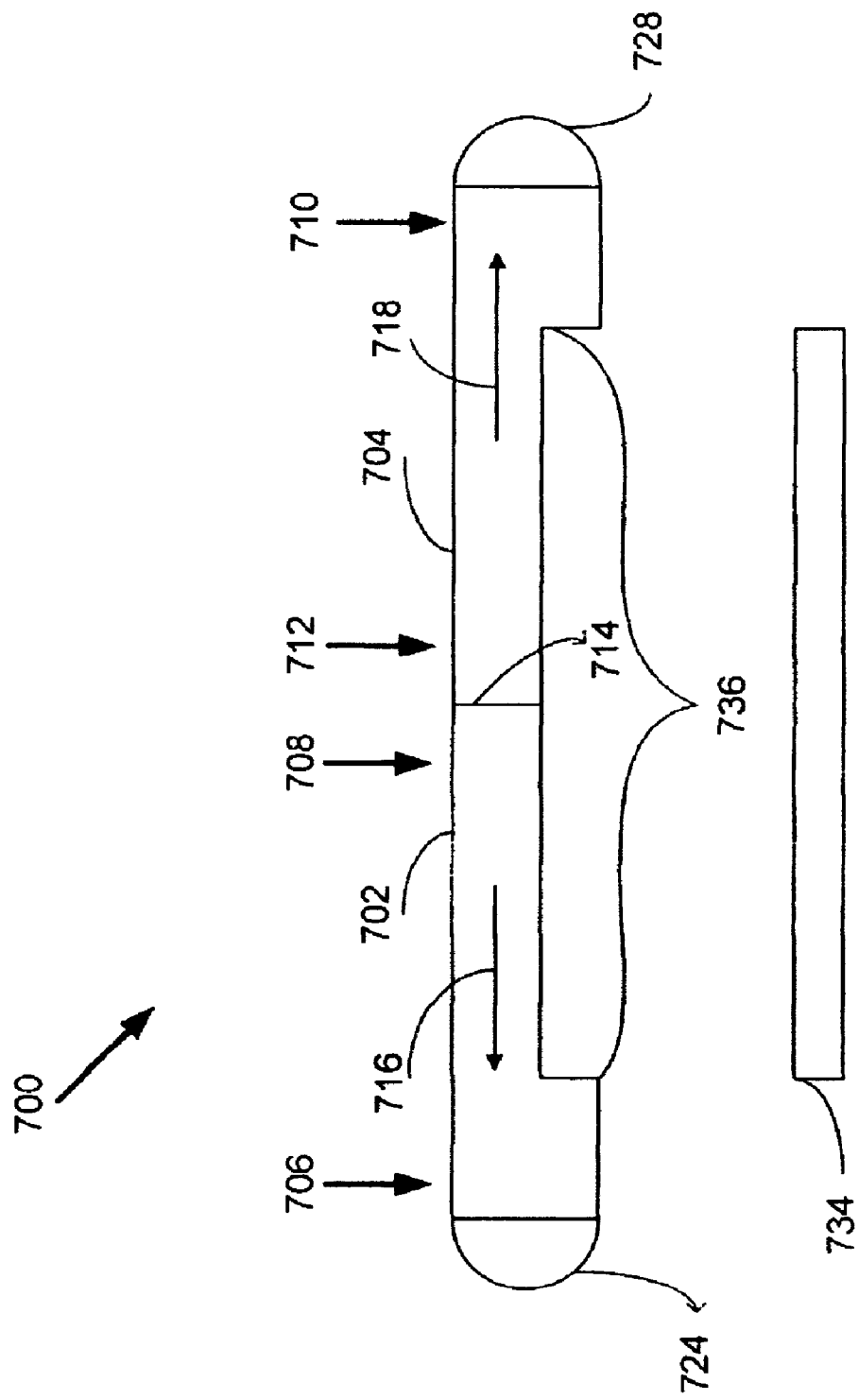
FIG. 7B displays one embodiment of a sectional view of an embodiment of a heat transfer system, such as a solid-state heat transfer system depicted in FIG. 7A.

FIG. 7B displays one embodiment of a sectional view of an embodiment of a heat transfer system. The sectional view of the heat transfer system of FIG. 7A along sectional line 726 is shown as heat transfer system 700. In heat transfer system 700, first electron conducting material 702 and second electron conducting material 704 are shown. First electron conducting material 702 and second electron conducting material 704 are joined at junction 714. Electrons migrate from junction 714 in the direction shown by directional arrows 716 and 718. As a result, a cold region 708 and a hot region 706 are created in the first electron conducting material 702. In addition, a cold region 712 and a hot region 710 develop in the second electron conducting material 704.

The connection of the first electron conducting material 702 and the second electron conducting material 704 form a receptacle 736. A processor 734 is mated with receptacle 736. In one embodiment, the processor 734 is mated with the receptacle 736 using a variety of techniques. For example, an adhesive may be used to mate the processor 734 with the receptacle 736, a coupling device, such as a hinge, socket, etc., may be used to mate the processor 734 with the receptacle 736. Further, a variety of connection and or coupling mechanisms may be used to mate the processor 734 with the receptacle 736.

During operation, heat is absorbed from the processor 734 into the cold region 708 of first electron conducting material 702 and the cold region 712 of second electron conducting material 704. The heat migrates to the hot region 706 of first electron conducting material 702 and to the hot region 710 of second electron conducting material 704. The heat is then transferred to cooled liquid flowing in the conduits 724 and 728. The cooled liquid becomes heated liquid and the heated liquid is conveyed away from the hot regions 706 and 710 using conduits 724 and 728.

Figure 8:
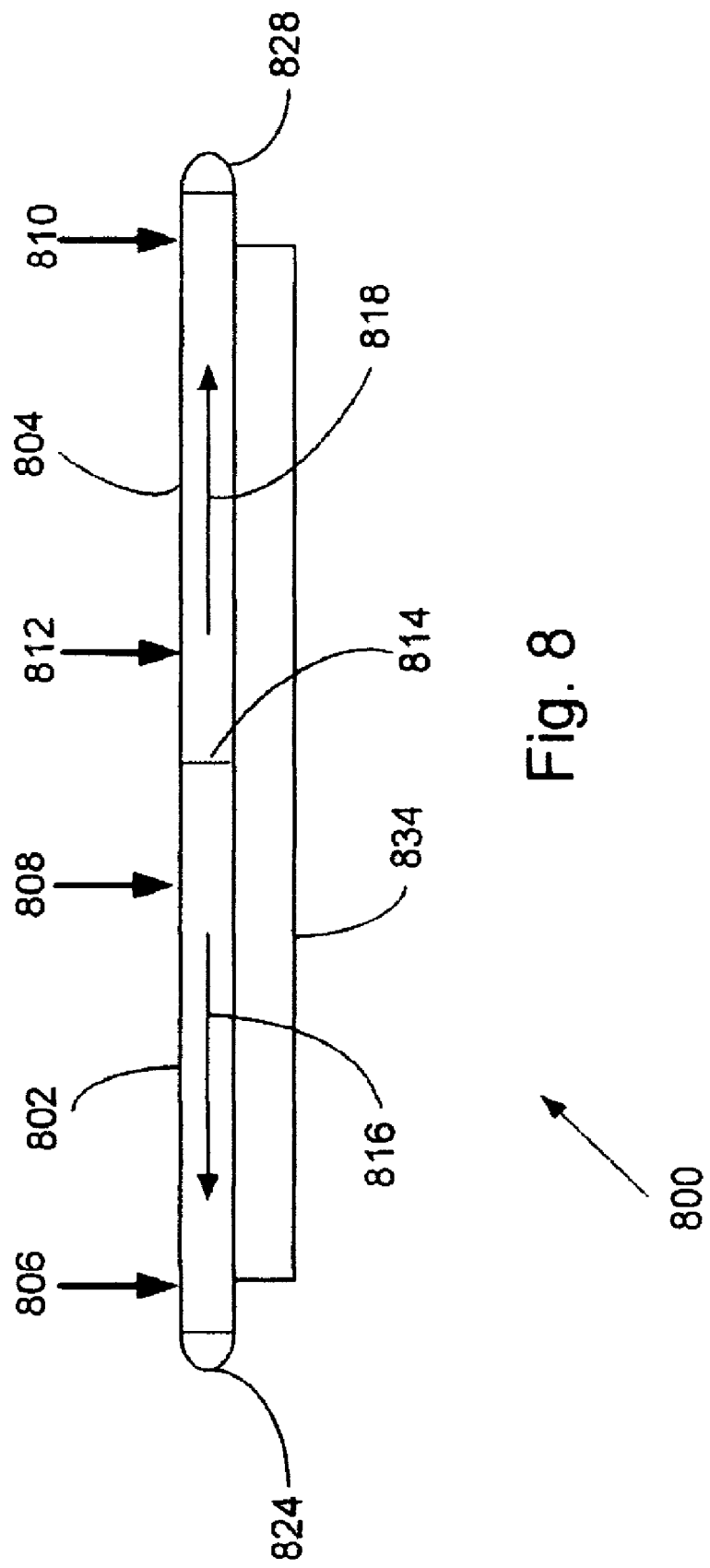
FIG. 8 displays another embodiment of a sectional view of an embodiment of a heat transfer system, such as a solid-state heat transfer system depicted in FIG. 7A.

FIG. 8 displays another embodiment of a sectional view of an embodiment of a heat transfer system. The sectional view of the heat transfer system 800 is shown. In heat transfer system 800, first electron conducting material 802 and second electron conducting material 804 are shown. First electron conducting material 802 and second electron conducting material 804 are joined at junction 814. Electrons migrate from junction 814 in the direction shown by directional arrows 816 and 818. As a result, a cold region 808 and a hot region 806 are created in the first electron conducting material 802. In addition, a cold region 812 and a hot region 810 develop at in the second electron conducting material 804.

During operation, heat is absorbed from the processor 834 into the cold region 808 of first electron conducting material 802 and the cold region 812 of second electron conducting material 804. The heat migrates to the hot region 806 of first electron conducting material 802 and to the hot region 810 of second electron conducting material 804. The heat is then transferred to cooled liquid flowing in the conduits 824 and 828. The cooled liquid becomes heated liquid and the heated liquid is conveyed away from the hot regions 806 and 810 using conduits 824 and 828.

A processor 834 is mated with first electron conducting material 802 and the second electron conducting material 804. In one embodiment, the processor 834 is mated with the first electron conducting material 802 and the second electron conducting material 804 using a variety of techniques. For example, an adhesive may be used to mate the processor 834 with the first electron conducting material 802 and the second electron conducting material 804. A coupling device, such as a hinge, socket, etc., may be used to mate the processor 834 with the first electron conducting material 802 and the second electron conducting material 804. Further, a variety of connection and/or coupling mechanisms may be used to mate the processor 834 with the first electron conducting material 802 and the second electron conducting material 804.

During operation, heat is absorbed from the processor 834 into the cold region 808 of first electron conducting material 802 and the cold region 812 of second electron conducting material 804. The heat migrates to the hot region 806 of first electron conducting material 802 and to the hot region 810 of second electron conducting material 804. The heat is then transferred to cooled liquid flowing in the conduits 824 and 828. The cooled liquid becomes heated liquid and the heated liquid is conveyed away from the hot regions 806 and 810 using conduits 824 and 828.

Figure 9:
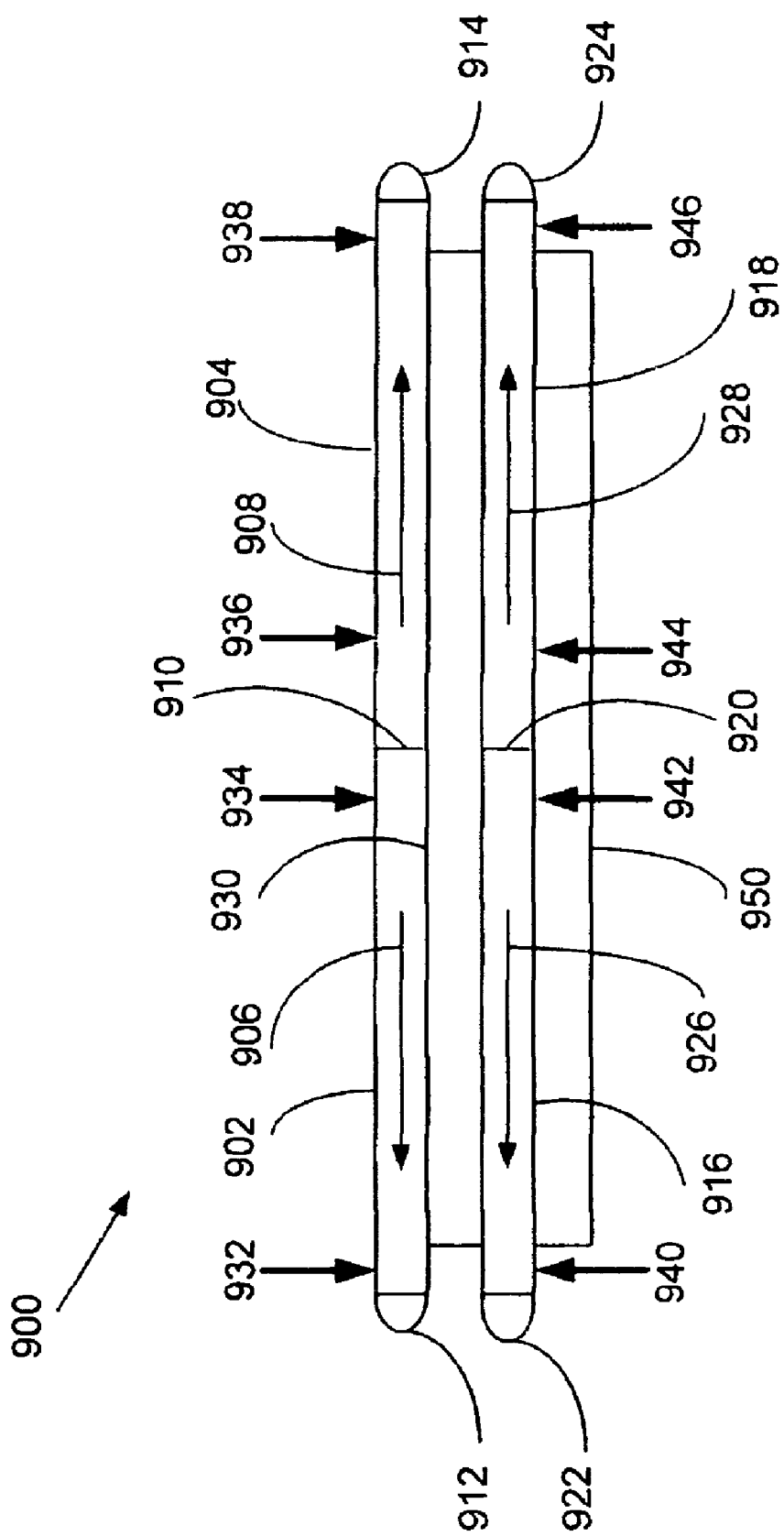
FIG. 9 displays one embodiment of a sectional view of a multi-layered heat transfer system, such as a multi-layered, solid-state heat transfer system.

FIG. 9 displays another embodiment of a sectional view of an embodiment of a heat transfer system, such as a multi-layered, solid-sate heat transfer system. In heat transfer system 900, first electron conducting material 902 and second electron conducting material 904 are shown. First electron conducting material 902 and second electron conducting material 904 are joined at junction 910. Electrons migrate from junction 910 in the direction shown by directional arrows 906 and 908. As a result, a cold region 934 and a hot region 932 are created in the first electron conducting material 902. In addition, a cold region 936 and a hot region 938 develop in the second electron conducting material 904.

A processor 930 is mated with first electron conducting material 902 and the second electron conducting material 904. In one embodiment, the processor 930 is mated with the first electron conducting material 902 and the second electron conducting material 904 using a variety of techniques. For example, an adhesive may be used to mate the processor 930 with the first electron conducting material 902 and the second electron conducting material 904. A coupling device, such as a hinge, socket, etc., may be used to mate the processor 930 with the first electron conducting material 902 and the second electron conducting material 904. Further, a variety of connection and/or coupling mechanisms may be used to mate the processor 930 with the first electron conducting material 902 and the second electron conducting material 904.

Third electron conducting material 916 and fourth electron conducting material 918 are joined at junction 920. Electrons migrate from junction 920 in the direction shown by directional arrows 926 and 928. As a result, a cold region 942 and a hot region 940 are created in the third electron conducting material 916. In addition, a cold region 944 and a hot region 946 develop at in the fourth electron conducting material 918.

A processor 950 is mated with first electron conducting material 902, second electron conducting material 904, third electron conducting material 916, and fourth electron conducting material 918. In one embodiment, the processor 950 is mated with the first electron conducting material 902, second electron conducting material 904, third electron conducting material 916, and fourth electron conducting material 918 using a variety of techniques. For example, an adhesive may be used to mate the processor 950 with the first electron conducting material 902, the second electron conducting material 904, the third electron conducting material 916, and the fourth electron conducting material 918. A coupling device, such as a hinge, socket, etc., may be used to mate the processor 950 with the first electron conducting material 902, the second electron conducting material 904, the third electron conducting material 916, and the fourth electron conducting material 918. Further, a variety of connection and/or coupling mechanisms may be used to mate the processor 950 with the first electron conducting material 902, the second electron conducting material 904, the third electron conducting material 916, and the fourth electron conducting material 918.

During operation, heat is generated by processors 930 and 950. The heat is absorbed from the processor 930 into the cold region 934 of first electron conducting material 902, into the cold region 936 of second electron conducting material 904, into the cold region 942 of third electron conducting material 916, and into the cold region 944 of fourth electron conducting material 918. The heat is absorbed from the processor 950 into the cold region 942 of third electron conducting material 916 and into the cold region 944 of fourth electron conducting material 918. The heat migrates to the hot region 932 of first electron conducting material 902, to the hot region 938 of second electron conducting material 904, to hot region 940 of third electron conducting material 916, and to hot region 946 of fourth electron conducting material 918. The heat is then transferred to cool liquid flowing in the conduits 912, 914, 922, and 924. The cooled liquid becomes heated liquid and the heated liquid is conveyed away from the hot regions 932, 938, 940, and 946 using conduits 912, 914, 922, and 924.

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A cooling system for cooling heat generating components comprising:
   N heat transfer units wherein more than one of the N heat transfer units includes an electron conducting material having a cold region thermally coupled to more than one heat generating components and a hot region thermally connected to a coolant pathway;
   N, or N+1 layers of one or more heat generating components per layer interleaved with the N heat transfer units such that one or more heat generating components are thermally coupled to one or more cold regions of the electron conducting materials;
   wherein heat is absorbed from the heat generating components into the cold regions of electron conducting materials, transferred to the hot regions of such electron conducting materials and transferred to a coolant circulating through the coolant pathway, the coolant becoming heated coolant; and
   wherein N is an integer greater than 1.

2. The cooling system as set forth in claim 1 further comprising:
   one or more heat exchange units coupled to the coolant pathway, the heat exchange units generating cooled coolant for transfer to the coolant pathway in response to receiving the heated coolant.

3. The cooling system as set forth in claim 1 wherein one or more heat generating components have more than one surface thereof thermally coupled to the cold region of more than one electron conducting material thereby enabling multi-sided cooling of such heat generating components.

4. The cooling system as set forth in claim 1 wherein one or more electron conducting materials have length and width dimensions larger than the depth dimension and wherein heat is transferred from the cold regions to the hot regions of such electron conducting materials along the length or width dimension.

5. The cooling system as set forth in claim 4 wherein the length and width dimensions are disposed in a parallel manner to the heat generating components.

6. The cooling system as set forth in claim 1 wherein the coolant pathway is disposed such that heated coolant from the transfer of heat from the hot region to the coolant is directed upward for enhancing convective flow of the coolant.

7. The cooling system of claim 1 wherein the cold region and the hot region are part of an electron conducting material coupled to a power source.

8. The cooling system of claim 1 wherein the electron conducting material is embedded in the substrate of a semiconductor material.

9. The cooling system of claim 1 wherein the electron conducting material is a solid state, peltier-effect device.

10. The cooling system as set forth in claim 1, wherein one or more of the heat transfer units comprise a first electron conducting material including a first hot region and a first cold region, a second electron conducting material and including a second hot region and a second cold region, and wherein the first hot region and the second hot region form the hot region and the first cold region and the second cold region form the cold region.

11. The cooling system as set forth in claim 10, wherein the first electron conducting material and the second electron conducting material are coupled at a junction.

12. A liquid cooling system as set forth in claim 11, wherein the first electron conducting material and the second electron conducting material form a junction for coupling to one or more heat generating components.

13. The cooling system of claim 10 wherein the first cold region and the second cold region are disposed in close proximity to each other and are thermally coupled to one or more heat-generating components and wherein the first hot region and the second hot region are thermally coupled to the coolant pathway, the cold regions absorbing heat from the heat-generating components and transferring such heat to the hot regions.

14. The cooling system of claim 10 wherein the first hot region and the second hot region are disposed in close proximity to each other and are thermally coupled to the coolant pathway and wherein the first cold region and the second cold region are thermally coupled to one or more heat-generating components, the cold regions absorbing heat from the heat generating components and transferring such heat to the hot regions.

15. An electronic system having the cooling system as set forth in claim 1.

16. A mobile electronic system having the liquid cooling system as set forth in claim 1.

17. A portable electronic system having the liquid cooling system as set forth in claim 1.

18. A system with optical devices having the liquid cooling system as set forth in claim 1.

19. A method for cooling heat generating components in a system having N heat transfer units wherein more than one of the N heat transfer units includes an electron conducting material having a cold region thermally coupled to more than one heat generating components and a hot region thermally connected to a coolant pathway, N or N+1 layers of one or more heat generating components per layer interleaved with the N heat transfer units such that one or more heat generating components are thermally coupled to one or more cold regions of the electron conducting materials, and wherein N is an integer greater than 1; the method comprising the steps of:

transferring heat from one or more heat-generating components to the cold region of one or more heat transfer units;

transferring heat from the cold region to the hot region of the heat transfer units; and absorbing heat from the hot region into a coolant circulating through the coolant pathway, thereby heating the coolant.

20. The method as set forth in claim 19 wherein one or more of the heat transfer units comprise a first electron conducting material including a first hot region and a first cold region, a second electron conducting material including a second hot region and a second cold region, and wherein the first hot region and the second hot region form the hot region and the first cold region and the second cold region form the cold region.

* * * * *